(12) United States Patent
Lin

(10) Patent No.: US 9,225,320 B1
(45) Date of Patent: Dec. 29, 2015

(54) HIGH-SPEED CLOCKED COMPARATOR AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 0 days.

(21) Appl. No.: 14/332,422

(22) Filed: Jul. 16, 2014

(51) Int. Cl.
*H03K 5/22* (2006.01)
*H03K 5/125* (2006.01)
*H02M 11/00* (2006.01)
*H03K 5/24* (2006.01)

(52) U.S. Cl.
CPC .............. *H03K 5/125* (2013.01); *H02M 11/00* (2013.01); *H03K 5/249* (2013.01); *H03K 5/2481* (2013.01)

(58) Field of Classification Search
CPC ......... H03K 5/22; H03K 5/24; H03K 5/2472; H03K 5/2481; H03K 5/249
USPC ..................... 327/63, 64, 65, 67, 97
See application file for complete search history.

(56) References Cited

U.S. PATENT DOCUMENTS

| | | | |
|---|---|---|---|
| 5,032,744 A * | 7/1991 | Wai Yeung Liu | 327/55 |
| 6,392,449 B1 * | 5/2002 | Taft | 327/55 |
| 6,448,822 B1 * | 9/2002 | Dadashev | 327/65 |

* cited by examiner

*Primary Examiner* — William Hernandez
(74) *Attorney, Agent, or Firm* — McClure, Qualey & Rodack, LLP

(57) ABSTRACT

A circuit includes a voltage-to-current converter receives a first voltage and a second voltage and outputs a first current and a second current in accordance with a clock signal. A first self-gated cascode circuit receives the first current and outputs a third current in accordance with the clock signal. A second self-gated cascode circuit receives the second current and outputs a fourth current in accordance with the clock signal. A latch circuit receives the third current and the fourth current and establishes a third voltage and a fourth voltage representing a resolution of a comparison between the third current and the fourth current, wherein the first self-gated cascode circuit is conditionally shut off based on a level of the third voltage, and the second self-gated cascode circuit is conditionally shut off based on a level of the fourth voltage.

10 Claims, 4 Drawing Sheets

HIGH-SPEED CLOCKED COMPARATOR AND METHOD THEREOF

BACKGROUND OF THE INVENTION

1. Field of the Invention

The present invention relates to comparators and more particularly to a high-speed clocked comparator circuit.

2. Description of Related Art

Persons of ordinary skill in the art understand terms and basic concepts related to microelectronics that are used in this disclosure, such as PMOS (p-channel metal-oxide semiconductor) transistor, NMOS (p-channel metal-oxide semiconductor) transistor, "gate," "source," "drain," "voltage," "current," "circuit," "circuit node," "power supply," "ground," "differential pair," "pseudo-differential pair," "clock," "comparator," "clock," "inverter," and "latch". Terms and basic concepts like these are apparent from prior art documents, e.g. text books such as "Design of Analog CMOS Integrated Circuits" by Behzad Razavi, McGraw-Hill (ISBN 0-07-118839-8), and thus will not be explained in detail here.

A clocked comparator is an apparatus for detecting a sign of a differential signal in accordance with a timing signal defined by a clock. A differential signal comprises a first end and a second end. A clocked comparator receives the differential signal and outputs a logical decision in accordance with the timing signal. In a phase of the clock, a level of the first end (of the differential signal) is compared with a level of the second end (of the differential signal), and the logical decision (which is a resolution as a result of the comparison) is made. The logical decision is set to "high" ("low") if the level of the first end is higher (lower) than the level of the second end. Merits of a clocked comparator are usually reckoned by two factors: speed and power consumption. Speed of a clocked comparator refers to how fast it can resolve a small differential signal, where a level of the first end is very close to a level of the second end. The power consumption of a clocked comparator refers to the energy it takes to fulfill the comparison function. In reality, there is a trade-off between the speed and the power consumption. As known in prior art, it takes a longer time to resolve a comparison for a small differential signal than for a large differential signal. Therefore, to achieve high speed, a pre-amplifier is usually used, so as to amplify the differential signal and thus facilitate the task of resolving the comparison. A pre-amplifier, however, increases the power consumption.

BRIEF SUMMARY OF THIS INVENTION

An objective of this present invention is to have a comparator having a high speed and low power consumption.

Another objective of this present invention is to enable a comparator to rapidly resolve a comparison between two signals and then shut itself off to save power after the comparison is resolved.

In an embodiment, a circuit comprises: a voltage-to-current converter for receiving a first voltage and a second voltage and outputting a first current and a second current in accordance with a clock signal; a first self-gated cascode circuit for receiving the first current and outputting a third current in accordance with the clock signal; a second self-gated cascode circuit for receiving the second current and outputting a fourth current in accordance with the clock signal; and a latch circuit for receiving the third current and the fourth current and establishing a third voltage and a fourth voltage representing a resolution of a comparison between the third current and the fourth current, wherein the first self-gated cascode circuit is conditionally shut off depending on a level of the third voltage, and the second self-gated cascode circuit is conditionally shut off depending on a level of the fourth voltage. In an embodiment, the first self-gated cascode circuit comprises an internal feedback loop. In an embodiment, the first self-gated cascode circuit comprises an internal feedback loop comprising a cascode device gated by a first internal voltage for passing the first current to the third current for the latch circuit to establish the third voltage; an activation switch controlled by the clock signal for coupling the third voltage to a second internal voltage; and an inverter for receiving the second internal voltage and outputting the first internal voltage. A replica of the first self-gated cascode circuit is used for embodying the second self-gated cascode circuit, with the roles of the first current, the third current, and the third voltage being replaced by those of the second current, the fourth current, and the fourth voltage, respectively.

In an embodiment, a method comprises: receiving a first voltage and a second voltage; receiving a clock signal comprising a first phase and a second phase; in the first phase, presetting a voltage-to-current converter, a first self-gated cascode circuit, and a second self-gated cascode circuit to a standby state; and in the second phase, converting the first voltage and the second voltage into a first current and a second current using the voltage-to-current converter, passing the first current and the second current to a latch circuit through the first self-gated cascode circuit and the second self-gated cascode circuit, respectively, wherein a comparison between the first current and the second current is resolved by the latch circuit and one of the first self-gated cascode circuit and the second self-gated cascode circuit is automatically shut off in accordance with a resolution of the comparison.

DETAILED DESCRIPTION OF THIS INVENTION

The present invention relates to comparator. While the specification describes several example embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

Throughout this disclosure: "VDD" denotes a power supply circuit node (or simply power supply node); a logical signal is a signal that is either "high" or "low"; it is said to be "high" when the logical signal is of a high voltage level that is equal to a voltage level of a power supply node (which is denoted by VDD in this disclosure); and it is said to be "low" when the logical signal is of a low voltage level that is equal to a voltage level of a ground node. It should be understood that, in this disclosure, "equal to" is stated in an engineering sense. For example, if a difference between a first voltage A and a second voltage B is smaller than a specified tolerance of interest, the difference is deemed negligible and as a result the first voltage A is said to be equal to the second voltage B in the engineering sense (i.e., for practical purposes). Likewise, "zero" in this disclosure is also stated in an engineering sense; for example, if a current is smaller than a specified tolerance of interest, the current is negligible and as a result is said to be zero in the engineering sense. In addition, a logical signal might be temporarily neither "high" nor "low"; this occurs, for instance, when the logical signal is in a process of transitioning from "high" to "low" or from "low" to "high," or in a process of resolving a decision. However, the logical signal is still said to be "logical" in nature because the process of transitioning or resolving is only temporary.

Figure 1A:
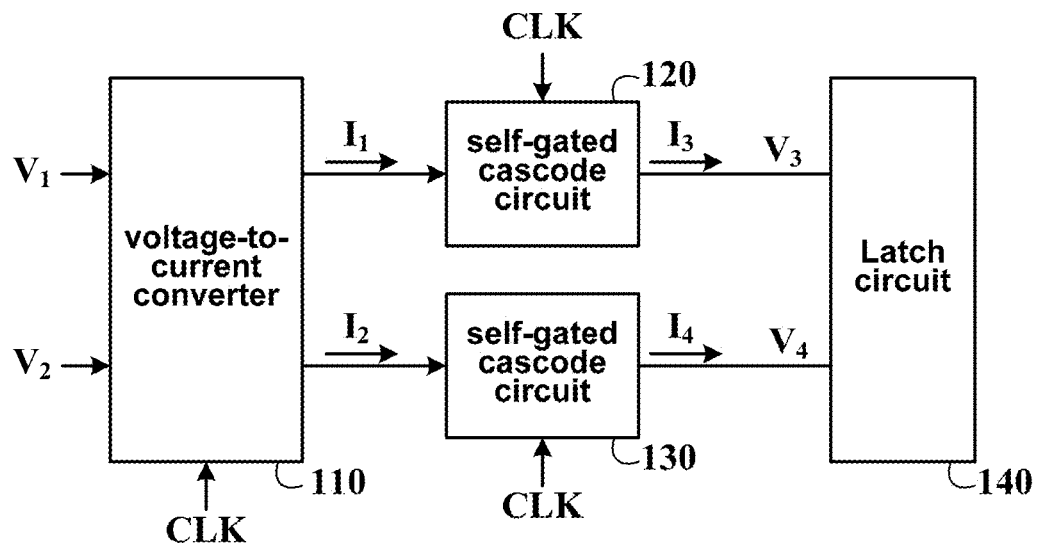
FIG. 1A shows a functional block diagram of a clocked comparator in accordance with an embodiment of the present invention.

A functional block diagram of a clocked comparator 100 in accordance with an embodiment of the present invention is shown in FIG. 1A. Clocked comparator 100 comprises: a voltage-to-current converter 110 for receiving a first voltage V1 and a second voltage V2 and outputting a first current I1 and a second current I2 in accordance with a timing defined by a clock signal CLK; a first self-gated cascode circuit 120 for receiving the first current I1 and outputting a third current I3 in accordance with a timing defined by the clock signal CLK; a second self-gated cascode circuit 130 for receiving the second current I2 and outputting a fourth current I4 in accordance with a timing defined by the clock signal CLK; and a latch circuit 140 for receiving the third current I3 and the fourth current I4 and establishing a third voltage V3 and a fourth voltage V4. Here, the clock signal CLK is a cyclic voltage signal that cyclically toggles between a low level (which is usually a ground level) and a high level (which is usually a power supply level).

Figure 1B:
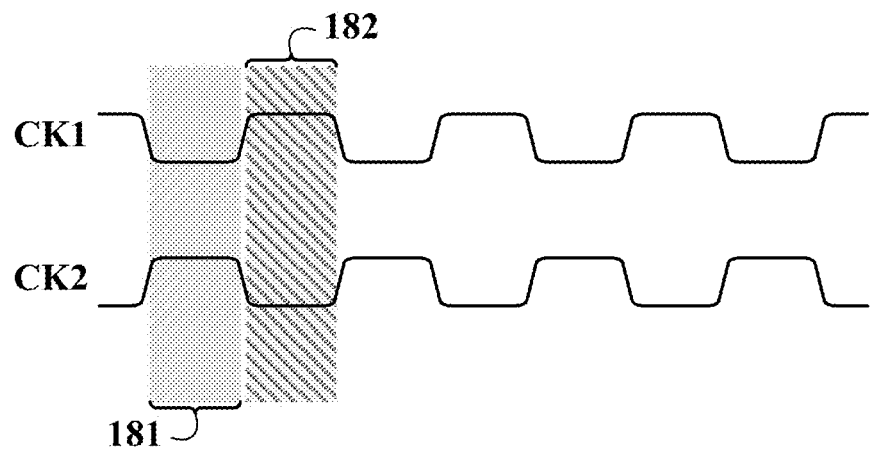
FIG. 1B shows a timing diagram of the clock signal for the clocked comparator of FIG. 1A.

In addition, the clock signal CLK includes a first clock CK1 and a second clock CK2 that is a complementary (i.e., logically inverted) clock of the first clock CK1, as depicted in an exemplary timing diagram shown in FIG. 1B. The clock signal CLK defines a phase of the clocked comparator 100; when CK1 is low and CK2 is high (e.g. region 181), the clocked comparator 100 is in a preset phase where voltages at certain circuit nodes within the clocked comparator 100 are preset to certain levels; when CK1 is high and CK2 is low (e.g. region 182), the clocked comparator 100 is in an active phase where a task of comparison takes place. Voltage-to-current converter 110 starts a voltage-to-current conversion when the clocked comparator 100 enters the active phase (i.e. CK1 toggles from low to high and CK2 toggles from high to low). As a result of the voltage-to-current conversion, the first current I1 and the second current I2 are generated so that a difference between the first current I1 and the second current I2 represents a difference between the first voltage V1 and the second voltage V2; the first current I1 and the second current I2 are passed to the latch circuit 140 via the first self-gated cascode circuit 120 and the second self-gated cascode circuit 130, respectively, and become the third current I3 and the fourth current I4, respectively; and the latch circuit 140 converts the third current I3 and the fourth current I4 into the third voltage V3 and the fourth voltage V4 that are logical in nature and represent a resolution of a comparison between the third current I3 and the fourth current I4. Before the comparison is resolved, both self-gated cascode circuits 120 and 130 are fully turned on to maximize I3 and I4 to maximize a speed of comparison by the latch circuit 140. After the comparison is resolved, one of the third voltage V3 and the fourth voltage V4 swings to high while the other swings to low. The self-gated cascode circuits 120 (130) senses a level of the third (fourth) voltage V3 (V4) and conditionally shuts itself off to ensure that the third (fourth) current I3 (I4) is zero after the comparison is resolved. (As mentioned earlier, "zero" here is stated in an engineering sense; for instance, the third current I3 is said to be zero if it is smaller than 1 nA in an embodiment of this present invention.) Therefore, the clocked comparator 100 can achieve both high speed and low power consumption.

Figure 2:
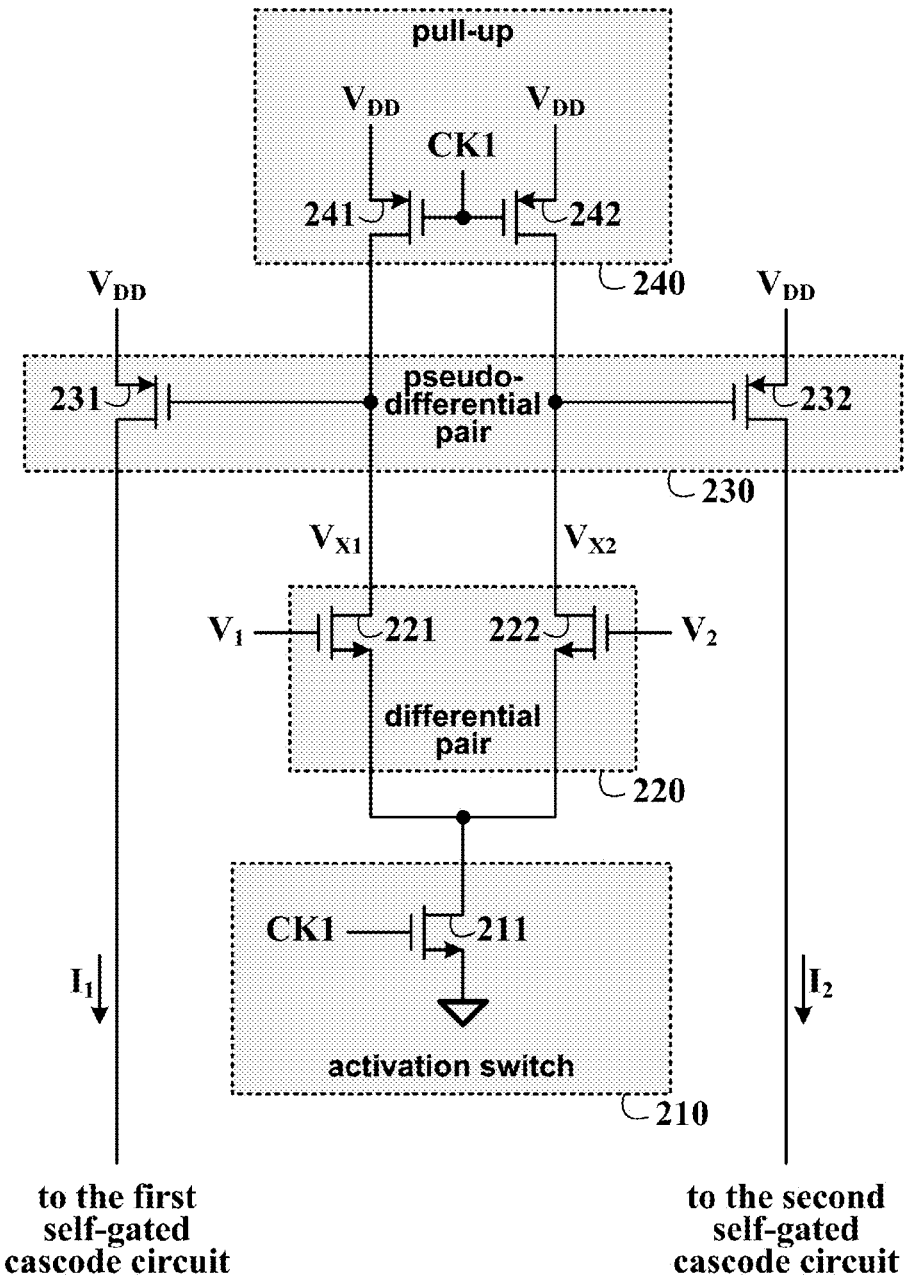
FIG. 2 shows a schematic diagram of a voltage-to-current converter suitable for use in the clocked comparator of FIG. 1A.

A schematic diagram of a voltage-to-current converter 200 suitable for embodying voltage-to-current converter 110 of FIG. 1A is shown in FIG. 2. Voltage-to-current converter 200 comprises: a differential pair 220 comprising NMOS transistors 221 and 222 for receiving the first voltage V1 and the second voltage V2 and outputting intermediate voltages VX1 and VX2, respectively; and a pseudo-differential pair 230 comprising PMOS transistors 231 and 232 for receiving the intermediate voltages VX1 and VX2 and outputting the first current I1 and the second current I2, respectively. Voltage-to-current converter 200 further comprises: an activation switch 210 comprising NMOS transistor 211; and a pull-up circuit 240 comprising PMOS transistors 241 and 242. The differential pair 220 can fulfill an amplification function by causing a difference between VX1 and VX2 greater than a difference between V1 and V2; the amplification function is activated when CK1 is high and deactivated when CK1 is low. The pseudo-differential pair 230 converts the intermediate voltages VX1 and VX2 into the first current I1 and the second current I2. When CK1 is low, the voltage-to-current converter 200 is in the preset phase, during which the activation switch 210 is turned off, the intermediate voltages VX1 and VX2 are pulled high by the pull-up circuit 240, and consequently the first current I1 and the second current I2 are turned off. When CK1 is high, the voltage-to-current converter 200 is in the active phase, during which the activation switch 210 is turned on, the intermediate voltages VX1 and VX2 are pulled down by NMOS transistors 221 and 222 separately at rates determined by V1 and V2, respectively, and as a result the first current I1 and the second current I2 are generated so that a difference between I1 and I2 represents a difference between VX1 and VX2, and therefore also represents a difference between V1 and V2.

Figure 3:
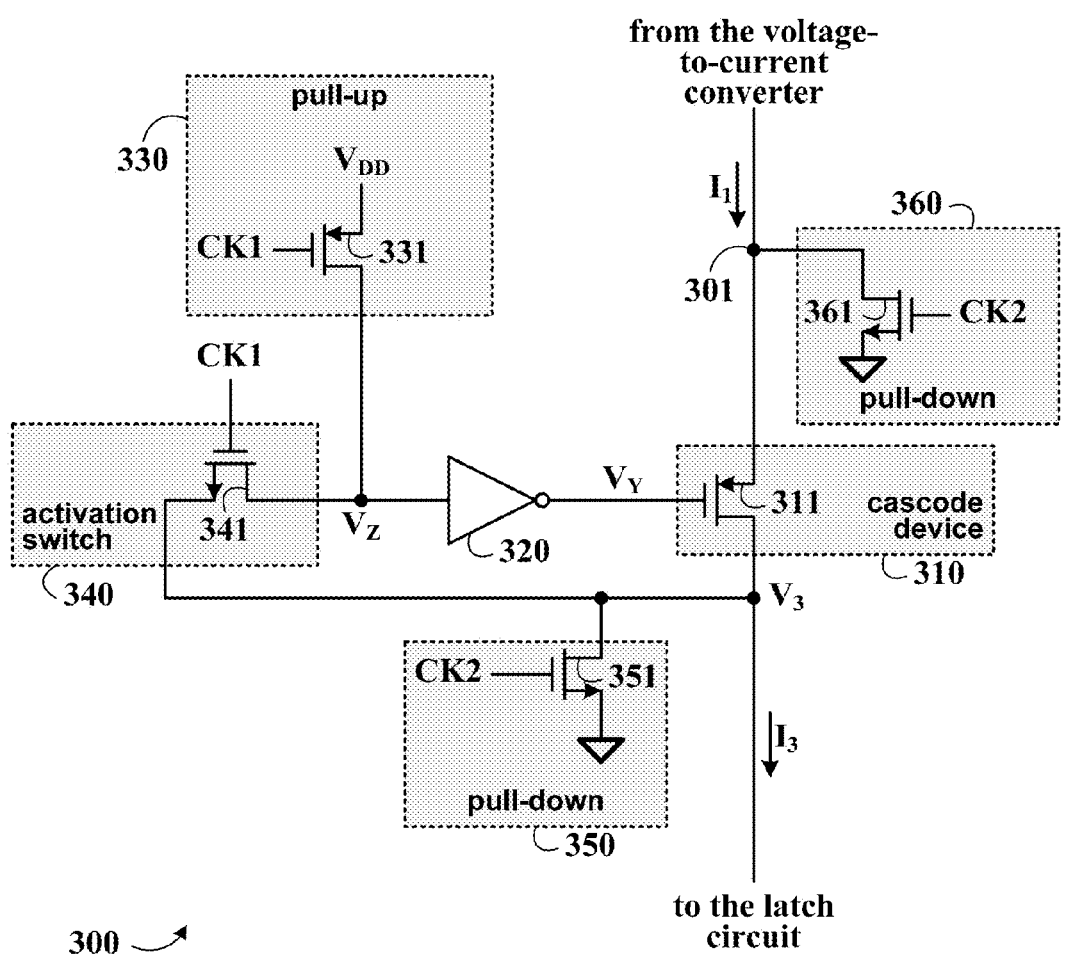
FIG. 3 shows a schematic diagram of a self-gated cascode circuit suitable for use in the clocked comparator of FIG. 1A.

A schematic diagram of a self-gated cascode circuit 300 suitable for embodying the self-gated cascode circuit 120 of FIG. 1A is shown in FIG. 3. Self-gated cascode circuit 300 comprises a feedback loop comprising a cascode device 310 (comprising PMOS transistor 311) for receiving the first current I1 and outputting the third current I3 in accordance with a control by a first internal voltage VY, an activation switch 340 (comprising NMOS transistor 341) for coupling the third voltage V3 to a second internal voltage VZ, and an inverter 320 for receiving the second internal voltage VZ and outputting the first internal voltage VY. Self-gated cascode circuit 300 further comprises a pull-up circuit 330 (comprising PMOS transistor 331), a pull-down circuit 350 (comprising NMOS transistor 351), and an another pull-down circuit 360 (comprising NMOS transistor 361). During the preset phase where CK1 is low and CK2 is high, the activation switch 340 is turned off and the feedback loop is effectively broken; at the same time, the circuit node 301 is pulled down to ground by the pull-down circuit 360, the third voltage V3 is pulled down to ground by the pull-down circuit 350, the second internal voltage VZ is pulled high to VDD by the pull-up circuit 330, and as a result the first internal voltage VY is pulled down to ground by the inverter 320. Upon entering the active phase where CK1 is high and CK2 is low, the first current I1 is turned on by the voltage-to-current converter (see FIG. 2), and the voltage at the circuit node 301 rapidly rises high toward VDD and consequently turns on the cascode device 310; the third current I3, which is approximately equal to the first current I1, is sent to the latch circuit (i.e., 140 of FIG. 1A) for a comparison to be resolved. After the comparison is resolved by the latch circuit, the third voltage V3 is either high or low. If V3 is high, then VZ is high, VY is low, and the voltage at the circuit node 301 is also high; in this case, the cascode device 310 remains turned on, but both I1 and I3 are nearly zero, since the drain-to-source voltage of PMOS transistor 311 is nearly zero. If V3 is low, then VZ is low and VY is high; in this case, the cascode device 310 is shut off, and as a result both I1 and I3 are nearly zero. In either case, once the resolution is made, both I1 and I3 are nearly zero. This fulfills the purpose of reducing power consumption while still allowing a high speed comparison thanks to the cascode device 310 being turned on before the resolution is made and conditionally turned off afterward if needed.

Inverter 320 is a CMOS inverter comprising a PMOS transistor and a NMOS transistor that is well known in prior art and thus not described in detail here.

When using the self-gated cascode circuit 300 for embodying the self-gated cascode circuit 120 of FIG. 1A, a replica of the self-gated cascode circuit 300, with I1, I3, and V3 being replaced with I2, I4, and V4, respectively, is used for embodying the self-gated cascode circuit 130 of FIG. 1A.

Figure 4:
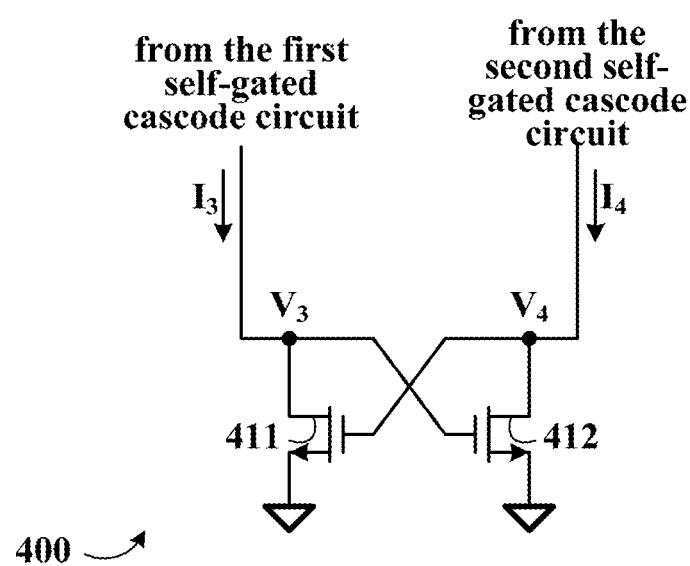
FIG. 4 shows a schematic diagram of a latch circuit suitable for use in the clocked comparator of FIG. 1A.

A schematic diagram of a latch circuit 400 suitable for embodying the latch circuit 140 of FIG. 1A is shown in FIG. 4. The latch circuit 400 comprises: a pair of cross-coupled NMOS transistors 411 and 412. In the preset phase where CK2 is high, V3 and V4 are pulled down to ground, and I3 and I4 are shut off by the first self-gated cascode circuit and the second self-gated cascode circuit, respectively. Upon entering the active phase, I3 and I4 are turned on by the first self-gated cascode circuit and the second self-gated cascode circuit, respectively, and the cross-coupled pair 410 resolves a difference between I3 and I4; V3 rises to high and V4 settles to low if I3 is greater than I4, otherwise V4 rises to high and V3 settles to low.

The clocked comparator 100 of FIG. 1A, along with the implementation using voltage-to-current converter 200 of FIG. 2, self-gated cascode circuit 300 of FIG. 3, and latch circuit 400 of FIG. 4, consumes nearly zero power in the preset phase (i.e. CK1 is low and CK2 is high) after the circuit nodes of interest (e.g. V3, VZ, VY, and circuit node 301 of FIG. 3) are preset to either high or low, and also consumes nearly zero power in the active phase (i.e. CK1 is high and CK2 is low) after a comparison is resolved due to using a self-gated cascode circuit. As a result, the overall power consumption is low. Besides, in the preset phase, the circuit nodes of interest are preset in a "standby" state in a way such that transistors of interest (e.g. NMOS transistors 221 and 222 and PMOS transistors 231 and 232 in FIG. 2, and PMOS transistor 311 in FIG. 3) can react quickly upon entering the active phase. As a result, the comparison can be quickly resolved. Therefore, high speed and low power consumption are both fulfilled.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit comprising:
 a voltage-to-current converter that receives a first voltage and a second voltage and outputs a first current and a second current in accordance with a clock signal;
 a first self-gated cascode circuit that receives the first current and outputs a third current in accordance with the clock signal;
 a second self-gated cascode circuit that receives the second current and outputs a fourth current in accordance with the clock signal; and
 a latch circuit that receives the third current and the fourth current and establishes a third voltage and a fourth voltage representing a resolution of a comparison between the third current and the fourth current, wherein the first self-gated cascode circuit is conditionally shut off based on a level of the third voltage, and the second self-gated cascode circuit is conditionally shut off based on a level of the fourth voltage.

2. The circuit of claim 1, wherein the first self-gated cascode circuit comprises an internal feedback loop.

3. The circuit of claim 2, wherein the internal feedback loop comprises:
 a cascode device gated by a first internal voltage that passes the first current to the third current for the latch circuit to establish the third voltage;
 an activation switch controlled by the clock signal coupling the third voltage to a second internal voltage; and an inverter that receives the second internal voltage and outputs the first internal voltage.

4. The circuit of claim 1, wherein the clock signal comprises a first phase and a second phase.

5. The circuit of claim 4, wherein in the first phase of the clock signal, the voltage-to-current converter, the first self-gated cascode circuit, and the second self-gated cascode circuit are preset to a standby state so that they do not consume power.

6. The circuit of claim 5, wherein transistors of the voltage-to-current converter and the first self-gated cascode circuit are preset so that they can react quickly upon entering the second phase.

7. A method comprising:
 receiving a first voltage and a second voltage;
 receiving a clock signal comprising a first phase and a second phase;
 in the first phase, presetting a voltage-to-current converter, a first self-gated cascode circuit, and a second self-gated cascode circuit to a standby state;
 in the second phase, converting the first voltage and the second voltage into a first current and a second current using the voltage-to-current converter, passing the first current and the second current to a latch circuit through the first self-gated cascode circuit and the second self-gated cascode circuit, respectively, wherein a comparison between the first current and the second current is resolved by the latch circuit and one of the first self-gated cascode circuit and the second self-gated cascode circuit is automatically shut off in accordance with a resolution of the comparison.

8. The method of claim 7, wherein the resolution of the comparison is represented by a third voltage and a fourth voltage.

9. The method of claim 8, wherein the first self-gated cascode circuit comprises a feedback loop comprising a cascode device gated by a first internal voltage for passing the first current to the latch circuit to establish the third voltage; an activation switch controlled by the clock signal for coupling the third voltage to a second internal voltage; and an inverter that receives the second internal voltage and outputs the first internal voltage.

10. The method of claim 8, wherein the second self-gated cascode circuit comprises a feedback loop comprising a cascode device gated by a first internal voltage that passes the second current to the latch circuit to establish the fourth voltage; an activation switch controlled by the clock signal coupling the fourth voltage to a second internal voltage; and an inverter that receives the second internal voltage and outputs the first internal voltage.

* * * * *